US006887580B2

(12) United States Patent
Tokuhisa et al.

(10) Patent No.: US 6,887,580 B2
(45) Date of Patent: *May 3, 2005

(54) ADHESIVE POLYIMIDE RESIN AND ADHESIVE LAMINATE

(75) Inventors: Kiwamu Tokuhisa, Chiba (JP); Akira Tokumitsu, Chiba (JP); Kazuaki Kaneko, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 219 days.

This patent is subject to a terminal disclaimer.

(21) Appl. No.: 10/182,402

(22) PCT Filed: Jan. 26, 2001

(86) PCT No.: PCT/JP01/00549

§ 371 (c)(1),
(2), (4) Date: Jul. 30, 2002

(87) PCT Pub. No.: WO01/57112

PCT Pub. Date: Aug. 9, 2001

(65) Prior Publication Data

US 2003/0012882 A1 Jan. 16, 2003

(30) Foreign Application Priority Data

Feb. 1, 2000 (JP) ........................... 2000-023700
Mar. 16, 2000 (JP) ........................... 2000-073545

(51) Int. Cl.[7] .................... C08G 73/10; B32B 15/08; B32B 27/00
(52) U.S. Cl. .............. 428/473.5; 428/411.1; 428/447; 428/457; 428/458; 528/26; 528/28; 528/125; 528/126; 528/128; 528/170; 528/172; 528/173; 528/176; 528/179; 528/183; 528/185; 528/220; 528/229; 528/350; 528/353; 264/212; 264/241; 264/298; 264/299; 264/319; 427/210; 427/307; 156/60
(58) Field of Search .................. 428/473.5, 411.1, 428/447, 457, 458; 528/26, 28, 38, 125–126, 128, 170, 172–173, 350, 353; 156/60; 427/210, 307; 264/212, 241, 298, 299, 319

(56) References Cited

U.S. PATENT DOCUMENTS 5,241,041 A   8/1993  Choi et al. ............... 528/353
5,932,345 A * 8/1999  Furutani et al. .......... 428/364
6,350,844 B1 * 2/2002  Ono et al. ................ 528/170
6,538,093 B2 * 3/2003  Sugo et al. ............... 528/28
6,693,162 B2 * 2/2004  Tsuji et al. .............. 528/170
2001/0031828 A1 * 10/2001  Honda et al. ............ 525/107

FOREIGN PATENT DOCUMENTS

| EP | 0 676 456 B1 | 3/1999 |
|---|---|---|
| EP | 0547555 | 6/1999 |
| EP | 01948992 | * 12/2002 |
| JP | 05-181274 | 7/1993 |
| JP | 05-247211 | 9/1993 |
| JP | 08-034968 | 2/1996 |
| JP | 08-218034 | 8/1996 |
| JP | 11-228825 | 8/1999 |
| JP | 11-310754 | 11/1999 |

OTHER PUBLICATIONS

International Search Report PCT/JP01/00549 mailed on May 1, 2001.

Translation of International Search Report mailed on Aug. 27, 2002.

* cited by examiner

Primary Examiner—P. Hampton Hightower
(74) Attorney, Agent, or Firm—Rader, Fishman & Grauer PLLC

(57) ABSTRACT

An adhesive polyimide resin which comprises a siloxane polyimide resin obtained from (A) an aromatic tetracarboxylic dianhydride and (B) a diamine ingredient comprising (B1) a diamine having a phenolic hydroxyl group, carboxyl group, or vinyl group as a crosslinkable reactive group and (B2) a siloxanediamine and has a glass transition temperature of 50 to 250□C and a Young's modulus (storage modulus) at 250□C of $10^5$ Pa or higher; and a laminate which comprises a substrate comprising a conductor layer and an insulating supporting layer having at least one polyimide resin layer and, disposed on a surface of the substrate, an adhesive layer comprising a layer of the adhesive polyimide resin. The adhesive polyimide resin and the laminate have satisfactory adhesion strength even after exposure to a high temperature of up to 270□C and further have excellent heat resistance in reflow ovens. They are hence suitable for use in the bonding of electronic parts.

9 Claims, No Drawings

ADHESIVE POLYIMIDE RESIN AND ADHESIVE LAMINATE

TECHNICAL FIELD

The present invention relates to an adhesive polyimide resin, which is useful as an adhesive for electronic parts, etc., and to a laminate having a layer of such an adhesive polyimide resin.

BACKGROUND ART

In recent years, associated with miniaturization and higher density of electronic apparatuses, high integration of semiconductor chips is being under way. Along with this, various proposals have been made on the package forms of semiconductors. For example, as the insulated substrates of packages, use is made of organic package substrates such as those comprised of epoxy resins or polyimide resins and inorganic substrates such as those comprised of silicon as well as metal plates for heat dissipation, and so forth. Therefore, the bonding of such different types of materials has become an important elementary technology on which the reliability of the whole package depends.

On the other hand, in the manufacturing process of packages, there are cases where in order to increase the workability, adhesives are applied in advance onto a surface of one of the substrates to be bonded to each other. Since the adhesives used in such a process are undergo processing steps of the substrate, and are thus required not to alter their characteristics when subjected to treatments with heat or chemicals. Furthermore, the adhesives used around semiconductors also undergo a reflow step; hence it is also important that their reduction in bonding strength is small when being subjected to high temperature, and that they contain less volatile components that cause contamination of the circuitry.

The adhesives that have heretofore been used for these purposes include thermosetting resins such as epoxy resins and acrylic resins and thermoplastic resins such as polyimide resins. Usually, the process of bonding is performed such that an adhesive (layer) is formed on one of the substrates to be adhered, and the substrates are bonded by using heat, pressure or the like. However, in an actual manufacturing process, a substrate on which an adhesive layer has been formed may in some cases undergo a heating step such as drying or preheating prior to its bonding. If the substrate undergoes such a step, then the thermosetting resins as described above will readily cure and their characteristics as adhesives are considerably decreased. If the exposure to the above-mentioned step is to be avoided, the coating of varnish for adhesive or application of an adhesive film must be performed immediately before the bonding. This significantly impairs the freedom of operation process.

On the other hand, thermoplastic resins used as hot-melt type adhesives must have higher glass transition temperature when it is intended to give sufficient heat resistance. To attain this, a very high temperature is required at the time of bonding, so that there is a fear in that substantial thermal damages will occur to the materials around them. Furthermore, when it is attempted to perform bonding at lower temperatures, the glass transition temperature of the thermoplastic resin must be low, which cause such a problem in that the heat resistance of the resin is decreased.

Hence, JP-A-08-034968 etc. also propose a blend type adhesive comprised of a mixture of a thermoplastic resin and a thermosetting resin. Also, there has been a report on a blend of a polyimide resin, which is thermoplastic, and an epoxy resin, which is thermosetting to secure workability and heat resistance. However, the unused components tend to remain and cause an increase in out gas components. Also utilization of siloxane polyimide resins excellent in adhesiveness as thermoplastic adhesives has been proposed. However, the siloxane polyimide resins show a considerable decrease in elastic modulus at the time of heating and cause the problem of peeling off or the like at the time of heating. Accordingly, while it is sure that the blend of a siloxane polyimide resin having an active group and an epoxy resin in order to increase the heat resistance can reduce or prevent a decrease in elastic modulus at the time of heating, but the blend like other thermosetting adhesives raises a problem in that its curing proceeds at relatively low temperatures as low as 200° C. or less, which imposes a significant limit on the production process than ever and extremely impairs the freedom of operation process.

Incidentally, as the method of connecting a semiconductor to a mother board, a transfer sealing method comprising mounting a semiconductor on a lead frame and transfer sealing it with an epoxy resin sealant has been known widely for long time. Recently, however, attention has been focused on a wiring board (interposer) having a polyimide tape as an insulating layer from the viewpoints of using narrower lines, heat release properties, and transmission properties.

Laminates (three-layer tapes) comprised by a polyimide film and a copper foil applied to each other with an adhesive are previously known widely as means of connecting a semiconductor for driving liquid crystals of TAB (tape automated bonding) type connection system. However, it cannot be said that they have sufficient heat resistance, electrolytic corrosion and laser processability for forming connection vias due to an influence of epoxy or acrylic-based adhesives. As a result, their application to packages, for which high reliability is required, has been limited.

Also, there has been a method of forming interposers by using a flexible substrate (two layer tape material) comprised by a polyimide film and a copper foil directly bonded to each other. In this case, too, the problem has arisen that no satisfactory reliability can be obtained because interposers cause blistering at a reflow temperature near 250° C. due to the adhesives having low heat resistance used for bonding and sealing with the semiconductor, or those used for bonding with a heat sink and a stiffener, or due to their insufficient resistance to electrolytic corrosion. Another problem is that even if one of adhesives having high heat resistance was applied, such adhesives, because they are of the thermosetting type, would have a deteriorated flowability in a thermocompression bonding step due to the thermal hysteresis prior to the thermocompression bonding step or deteriorated adhesiveness with semiconductor chips.

DISCLOSURE OF THE INVENTION

Accordingly, an object of the present invention is to provide an adhesive polyimide resin that shows a less decrease in adhesiveness at temperatures to which it is frequently exposed in pretreatment steps prior to bonding electronic components (270° C. or less), is high in the degree of freedom in the steps after the formation of an adhesive layer and excellent in heat resistance.

Another object of the present invention is to provide a laminate that has good flowability at the time of thermocompression bonding even after being subjected to the above-mentioned thermal hysteresis and in addition is excellent in adhesiveness to silicon, polyimide and various metals and in heat resistance at the time of reflow.

As a result of extensive studies of such issues, the inventors of the present invention have found that using specified siloxane polyimide resins obtained by using a diamine component having a crosslinkable reactive group as the polyimide resin solves the above-mentioned problems. The present invention has been achieved based on this finding.

The present invention relates to an adhesive polyimide resin, which mainly comprises a siloxane polyimide resin obtained from (A) an aromatic tetracarboxylic dianhydride and (B) a diamine ingredient comprising (B1) a diamine having a crosslinkable reactive group and (B2) a siloxanediamine and has a glass transition temperature of from 50 to 250° C. and a Young's modulus (storage modulus) at 250° C. of $10^5$ Pa or higher.

Also, the present invention relates to an adhesive polyimide resin for electronic components, in which the adhesive polyimide resin has a peel strength retention of 50% or more, the peel strength retention being defined as a ratio ($P_2/P_1$) of the peel strength $P_1$ obtained by coating a onto a substrate siloxane polyimide precursor-containing resin solution in a stage prior to forming the adhesive polyimide resin, drying, heat-treating at 180° C. for 5 minutes and thermocompression-bonding the resultant to an adherend and the peel strength $P_2$ obtained by thermocompression-bonding the resultant to the adherend after further heat-treating the resultant at 270° C. for 5 minute.

Further, the present invention relates to a laminate which comprises a substrate having formed thereon in order a conductor, an insulating supporting layer and an adhesive polyimide resin layer, in which the insulating supporting layer has an average thermal expansion coefficient of $30 \times 10^{-6}$ or less and in which the adhesive polyimide resin layer comprises a laminate formed of the above-mentioned adhesive polyimide resin.

Also, in the present invention, at least one silicon chip is bonded to the above-mentioned laminate through the adhesive polyimide resin layer, and the laminate has a 90° peel strength between a surface of the silicon chip and the adhesive polyimide resin layer at room temperature of 0.8 kN/m or more.

Further, the present invention relates to a method of producing the above-mentioned laminate, comprising: directly coating a polyimide precursor resin solution on a conductor to form at least one layer of a polyimide precursor resin on the conductor; heat curing the polyimide precursor resin layer to form a conductor/polyimide laminate; coating an adhesive polyimide precursor resin solution on a polyimide surface of the laminate; and heating the solution.

Also, the present invention relates to a polyimide resin which comprises a siloxane polyimide resin obtained from (A) an aromatic tetracarboxylic dianhydride and (B) a diamine ingredient comprising (B1) a diamine having a crosslinkable reactive group and (B2) a siloxanediamine and has a glass transition temperature of from 50 to 250° C. and a Young's modulus (storage modulus) at 250° C. of $10^5$ Pa or higher.

Hereinafter, the present invention will be described in detail.

The adhesive polyimide resin of the present invention comprises a siloxane polyimide resin as a main component and can be obtained from (A) an aromatic tetracarboxylic dianhydride and (B) a diamine.

Examples of the aromatic tetracarboxylic acid dianhydride (A) include, but not particularly limited to, the following compounds: pyromellitic acid dianhydride; 2,2',3,3'-, 2,3,3',4'- or 3,3',4,4'-benzophenonetetracarboxylic acid dianhydride; 2,3,6,7-, 1,2,4,5-, 1,4,5,8-, 1,2,6,7- or 1,2,5,6-naphthalenetetracarboxylic acid dianhydride; 4,8-dimethyl-1,2,3,5,6,7-hexahydronaphthalene-1,2,5,6-tetracarboxylic acid dianhydride; 2,6- or 2,7-dichloronaphthalene-1,4,5,8-tetracarboxylic acid dianhydride; 2,3,6,7-(or 1,4,5,8-)tetrachloronaphthalene-1,4,5,8- (or 2,3,6,7-) tetracarboxylic acid dianhydride; 3,3',4,4'-, 2,2', 3,3'- or 2,3,3',4'-biphenyltetracarboxylic acid dianhydride; 3,3",4,4"-, 2,3,3", 4"- or 2,2",3,3"-p-terphenyltetracarboxylic acid dianhydride; 2,2-bis(2,3- or 3,4-dicarboxyphenyl)-propanedianhydride; bis(2,3-dicarboxyphenyl) etherdianhydride; bis(2,3- or 3,4-dicarboxyphenyl) methanedianhydride; bis(2,3- or 3,4-dicarboxyphenyl) sulfonedianhydride; 1,1-bis(2,3- or 3,4-dicarboxyphenyl) ethanedianhydride; 2,3,8,9-, 3,4,9,10-, 4,5,10,11- or 5,6,11, 12-perylene-tetracarboxylic acid dianhydride; 1,2,7,8-, 1,2, 6,7- or 1,2,9,10-phenanthrene-tetracarboxylic acid dianhydride; cyclopentane-1,2,3,4-tetracarboxylic acid dianhydride; pyrazine-2,3,5,6-tetracarboxylic acid dianhydride; pyrrolidine-2,3,4,5-tetracarboxylic acid dianhydride; thiophene-2,3,4,5-tetracarboxylic acid dianhydride; and 4,4'-oxydiphthaiic acid dianhydride. Those compounds may be used alone or in combination of more than one of the above-mentioned components. Of those, 4,4'-oxydiphthalic acid, 3,3',4,4'-biphenyltetracarboxylic acid dianhydride, bis (3,4-dicarboxyphenyl)sulfone dianhydride, 3,3',4,4'-benzophenone tetracarboxylic acid dianhydride, and pyromellitic acid dianhydride are suitable because they have excellent characteristics in solubility in organic solvents and in adhesion to adherend materials such as copper face, etc. when a polyimide resin is used.

The diamine (B) used in the present invention is not particularly limited so far as it contains (B1) a diamine having a crosslinkable reactive group and (B2) a siloxanediamine. Furthermore, (B3) another diamine component other than these may also be used.

The diamine (B1) having a crosslinkable reactive group is not particularly limited so far as it is a diamine having a crosslinkable reactive group. However, preferred are those diamine components having at least one crosslinkable reactive group selected from a phenolic hydroxyl group, a carboxyl group and a vinyl group. These crosslinkable reactive groups have the effect of increasing the reflow heat resistance of the resulting polyimide by reaction with an amino group, an acid anhydride group or a carboxyl group at the terminal of the polyimide resin at the time of thermocompression bonding at high temperatures to increase the elastic modulus at high temperatures. The crosslinking reaction proceeds remarkably at 270° C. or more, so that processing flowability can be maintained even when the polyimide resin is subjected to thermal hysteresis up to 270° C. prior to the thermocompression bonding.

Preferable specific examples of the diamine having crosslinkable reactive group (B1) include 3,3'-dihydroxy-4,4'-diaminobiphenyl, 3,5-diamino benzoic acid, 1,8-diamino-4, 5-hydroxyanthraquinone, 2,4-diamino-6-hydroxypyrimidine, 2,3-diaminophenol, ω,ω'-bis(3-aminopropyl) polymethylvinylsiloxane, and the like.

A preferred use proportion of the diamine (B1) having a crosslinkable reactive group is in the range of from 5 to 95 mole % based on the total diamine (B). In particular, in the case where the diamine has a phenolic hydroxyl group or a carboxylic group as a crosslinkable reactive group, the use proportion of (B1) occupied in the total diamine (B) is preferably in a range of from 5 to 30 mole %. When this proportion is 5 mole % or less, the resultant polyimide will become lower in heat resistance while when it is 30 mole % or more, there is the possibility that the adhesiveness will be decreased. Furthermore, in the case where the polyimide has a vinyl group as a crosslinkable reactive group, the use proportion of (B1) in the total diamine (B) is preferably in a range of from 20 to 95 mole %, with the use proportion of 20 mole % or less giving a polyimide being low in heat resistance.

The siloxanediamine (B2) includes a siloxane diamine of the general formula (1) below as a preferred example.

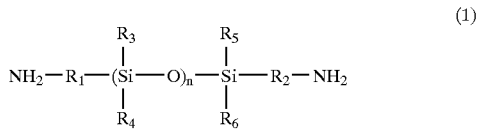

(1)

In the general formula (1) above, $R_1$ and $R_2$ independently represent a divalent hydrocarbon group, preferably a polymethylene group having 2 to 6, more preferably 3 to 5, carbon atoms or a phenylene group. $R_3$ to $R_6$ independently represent a hydrocarbyl group having 1 to 6 carbon atoms, preferably a methyl group, an ethyl group, a propyl group or a phenyl group. Further, n, which represents an average number of repeating units, is from 1 to 10, preferably from 3 to 9.

Examples of specific compounds of the siloxane diamine (B2) include ω,ω'-bis(2-aminoethyl)polydimethylsiloxane, ω,ω'-bis(3-aminopropyl)polydimethylsiloxane, ω,ω'-bis(4-aminophenyl)polydimethylsiloxane, ω,ω'-bis(3-aminopropyl)polydiphenylsiloxane, ω,ω'-bis(3-aminopropyl)polymethylphenylsiloxane, and the like.

A preferred use proportion of the siloxanediamine (B2) in the total diamine (B) is in a range of from 5 to 95 mole %. When the proportion is 5 mole % or less, the thus obtained polyimide will become lower in adhesiveness while when it is 95 mole % or more, the proportion of the diamine having a crosslinkable reactive group will be decreased so that the polyimide will become lower in heat resistance.

Examples of the diamine component other than B1 and B2 component (B3) include, but not particularly limited to, the following compounds: 3,3'-dimethyl-4,4'-diaminobiphenyl, 4,6-dimethyl-m-phenylenediamine, 2,5-dimethyl-p-phenylenediamine, 2,4-diaminomesitylene 4,4'-methylenedi-o-toluidine, 4,4'-methylenedi-2,6-xylidine, 4,4'-methylene-2,6-diethylaniline, 2,4-toluenediamine, m- or p-phenylene-diamine, 4,4'- or 3,3'-diamino-diphenylpropane, 4,4'- or 3,3'-diamino-diphenylethane, 4,4'- or 3,3'-diamino-diphenylmethane, 2,2-bis[4-(4-aminophenoxy)phenyl]propane, 4,4'- or 3,3'-diamino-diphenylsulfide, 4,4'- or 3,3'-diamino-diphenylsulfone, 4,4'- or 3,3'-diamino-diphenylether, benzidine, 3,3'-diamino-biphenyl, 3,3'-dimethyl-4,4'-diamino-biphenyl, 3,3'-dimethoxy-benzidine, 4,4"- or 3,3"-diamino-p-terphenyl, bis (p-amino-cyclohexyl) methane, bis(p-β-amino-t-buthylphenyl)ether, bis(p-β-methyl-δ-aminopentyl) benzene, p-bis(2-methyl-4-amino-pentyl)benzene, p-bis(1, 1-dimethyl-5-amino-pentyl)benzene, 1,5- or 2,6-diamino-naphthalene, 2,4-bis(β-amino-t-butyl)toluene, 2,4-diamino-toluene, m- or p-xylene-2,5-diamine, m- or p-xylylene-diamine, 2,6- or 2,5-diamino-pyridine, 2,5-diamino-1,3,4-oxadiazole, piperazine, 1,3-bis (3-aminophenoxy)benzene, and the like. Those compounds may be used alone or in combination of more than one of the above-mentioned compounds. Of those, p-phenylene-diamine, 2,2-bis[4-(4-aminophenoxy)phenyl]propane, 4,4'-diamino-diphenylether, and 1,3-bis (3-aminophenoxy)benzene are suitable, because they have excellent characteristics in solubility in organic solvent, etc, thus they can be easily used for reactions.

In the case where the diamine component (B3) is used, a preferred use proportion thereof is in a range of from 0 to 80 mole % based on the total diamine (B). When the proportion is 80 mole % or more, the fraction of the diamine having a crosslinkable reactive group will be decreased and the thus obtained polyimide will become lower in heat resistance.

In summary, the compounding ratios occupied by the diamines (B1), (B2) and (B3) in the diamine (B) are from 5 to 95 mole %, preferably from 5 to 30 mole % and more preferably from 10 to 20 mole %, for (B1); from 5 to 95 mole %, preferably from 10 to 70 mole % and more preferably from 30 to 60 mole %, for (B2); and from 0 to 80 mole %, preferably from 10 to 70 mole % and more preferably from 20 to 50 mole %, for (B3), provided that the diamine (B) is the sum of the diamines (B1), (B2) and (B3).

The production method for the siloxane polyimide resin of the present invention is not particularly limited and known polymerization methods can be used. It is preferred to use a method comprising at least two stages, one in which the reaction is performed until imidation between the siloxanediamine (B2) and the aromatic tetracarboxylic dianhydride (A) is completed and the other in which subsequently the diamine (B1) having a crosslinkable reactive group and the aromatic tetracarboxylic dianhydride (A) are allowed to react until a corresponding polyamic acid is formed. In the case where the other diamine (B3) is used, it is preferred that the reaction is performed in such a manner that polyamic acid is formed as in the reaction between the diamine (B1) having a crosslinkable reactive group and the aromatic tetracarboxylic dianhydride (A). Adoption of such a polymerization method can provide a copolymerized siloxane polyimide resin precursor that contain an imidated portion and another portion that remains in a stage of an amic acid, which is a precursor of an imide.

When performing heat treatment of a solution of the polyimide precursor resin produced from the diamine (B1) having a crosslinkable reactive group and the aromatic tetracarboxylic dianhydride (A) at 150° C. or more, crosslinking readily proceeds in the solution, making it difficult to perform subsequent processing. The polyimide precursor resin produced from the siloxanediamine (B2) and the aromatic tetracarboxylic dianhydride is relatively high in hydrolyzability as compared with the aromatic polyimide precursor resin so that it is poor in storage stability in the solution. Therefore, it is recommendable to previously imidate the amic acid sites.

An advantageous polymerization method includes the following method. That is, the aromatic tetracarboxylic dianhydride (A) is dissolved or suspended in an organic solvent in advance and the siloxanediamine (B2) is gradually added to the solution. Thereafter, the mixture is allowed to polymerize and imidate at a temperature of from 150 to 210° C. for from 10 to 24 hours while removing condensation water to obtain siloxane polyimide having an acid anhydride at the terminals thereof. Next, after once cooling the reaction mixture to near room temperature, the diamine (B1) having a crosslinkable reactive group, or the diamine (B1) and the other diamine (B3) as well as a shortfall of the acid dianhydride (A) are added such that the acid dianhydride (A) and the total diamine (B) are approximately equimolar and the mixture is allowed to react at from 10 to 80° C. for from 1 to 3 hours to obtain a solution of a siloxane polyimide precursor resin having a crosslinkable reactive group.

The organic solvent used in the reaction is not particularly limited and a single solvent or a mixed solvent containing two or more solvents in combination may be used without hindrance so far as it can uniformly dissolve the composition concerned. Examples of the organic solvent include phenol solvents, amide solvents (pyrrolidone solvents, acetamide solvents, etc.), oxane solvents (dioxane, trioxane, etc.), ketone solvents (cyclohexanone, etc.), glyme solvents (methyldiglyme, methyltriglyme, etc.) and the like. If necessary, aromatic hydrocarbon solvents such as benzene and toluene and aliphatic hydrocarbon solvents such as hexane and decane may be used to be mixed with the above-mentioned organic solvents in amounts in which the resulting mixtures can uniformly dissolve the composition concerned. In consideration of a reduction in reaction time and the problem of dissipation of solvents, those solvents having a boiling point of 150° C. or more are preferred, and in particular organic polar solvents having a boiling point of 200° C. or more (for example, N-methyl-2-pyrrolidinone, methyl triglyme, etc.) are most preferred.

The molecular weight of the siloxane polyimide precursor resin in the solution can be controlled by adjusting the molar ratios of the monomer components as in the case of usual polycondensed polymers. That is, it is preferred that from 0.8 to 1.2 moles of the diamine (B) is used per mole of the aromatic tetracarboxylic dianhydride (A). If the molar ratio is 0.8 or less or 1.2 or more, only those resins having low molecular weights can be obtained so that no sufficient heat resistance can be obtained. More preferably, from 0.95 to 1.05 moles, particularly preferably from 0.98 to 1.02 moles, of the diamine (B) is used per mole of the aromatic tetracarboxylic dianhydride (A).

The above-mentioned siloxane polyimide precursor resin, when completely imidated, has the repeating units of the general formulae (2) and (3) below, respectively, to become a solvent soluble type polyimide that can readily form a film.

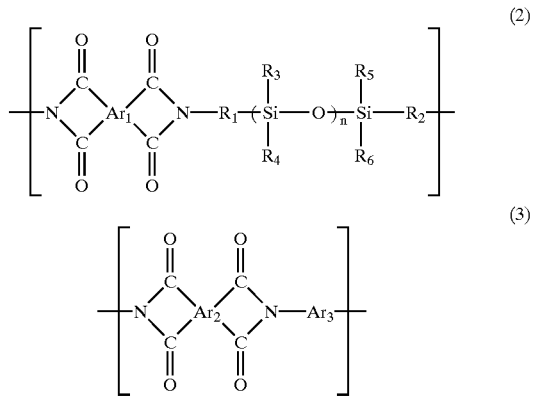

(wherein $Ar_1$ represents a tetravalent aromatic group derived from the above-mentioned aromatic tetracarboxylic dianhydride (A); $R_1$ to $R_6$ and n have the same meanings as described for the formula (1) above; and $Ar_3$ represents a divalent aromatic group derived from the above-mentioned crosslinking diamine (B1) or the other diamine (B3).

The proportions of the above-mentioned repeating units present in the siloxane polyimide resin depend on the use proportions of (B1), (B2) and (B3) in the diamine (B) used.

The adhesive polyimide resin of the present invention may be the siloxane polyimide resin alone or may be the siloxane polyimide resin blended with small amounts of other components so far as the resultant polyimide resin has the physical properties within the scope of the present invention.

Further, the other components that can be blended with the above-mentioned siloxane polyimide resin, for example, for the purpose of improving moldability in the thermocompression bonding step include thermosetting resins such as epoxy resins, acrylate resins, urethane resins, and cyanate resins. Furthermore, if necessary, known coupling agents, fillers, pigments, thixotropy imparting agents, defoaming agents and the like may be blended as appropriate. Those that do not decompose or volatilize at a temperature as high as above 300° C. are preferred.

The thermosetting resins improve the flowability of the adhesive polyimide at the time of high temperature bonding and also are effective in improving the heat resistance of the adhesive polyimide after curing by crosslinking with the functional groups in the polyimide structure at the time of high temperature bonding or at the time of postbaking. Even in the case where other components are blended, the use amount thereof up to 20% by weight is recommendable.

When an adhesive polyimide resin is formed, it is preferred to heat and dry a solution of the siloxane polyimide precursor resin or a solution of the siloxane polyimide precursor resin blended with the above-mentioned optional components. Coating the solution on an adherend or a peelable substrate and heating and drying it can give rise to an adherend or peelable substrate having a film or thin film adhesive polyimide resin layer.

The method of obtaining an adhesive polyimide resin layer or a film thereof is not particularly limited. However, it is preferred to coat a siloxane polyimide precursor resin-containing solution containing the siloxane polyimide precursor resin and the optional components on a sheet-like object and heat it at 300° C. or less, preferably 180 to 270° C. for several minutes to imidate it. However, in order to retain adhesiveness, it is preferred to use conditions under which the crosslinking reaction through a crosslinkable reactive group does not sufficiently proceed.

Advantageously, the siloxane polyimide precursor resin-containing solution thus obtained is coated on any desired substrate and preliminarily dried at a temperature of 130° C. or less for 10 to 30 minutes and then is heat-treated at a temperature of usually about 180 to about 270° C. for about 2 to about 30 minutes for removing the solvent and effecting imidation. The polyimide resin initiates crosslinking at a temperature equal to or higher than its glass transition temperature. However, unless sufficient temperature and time are given, the crosslinking reaction through a crosslinkable reactive group is not completed.

The adhesive polyimide resin obtained through the heat treatment in this manner is preferably formed into a film-like product having a thickness of 10 to 100 μm. Forming into a film-like product can provide it as an adhesive polyimide film suitable for use in electronic components. That is, when a readily peelable substrate, such as a glass plate or a film subjected to release treatment is used as a substrate, the substrate can be peeled off and the separated film can be used as an adhesive polyimide film. Also, it is possible to directly coat the siloxane polyimide precursor resin-containing solution onto electronic components, etc. as an adherend and the heat treatment is performed thereon in the same manner as described above to make an adhesive polyimide resin film layer of the present invention.

It should be noted that after the heat treatment at 180 to 270° C., imidation is substantially completed. To perform more complete imidation and remove low molecular weight components, it is preferred to additionally perform the heat treatment at about 270° C. for about 5 minutes. Completion of the imidation can be confirmed by measurement of imidation rate. The imidation rate can be measured by an infrared absorption spectrum analysis method. In the polymer of which the imidation has been substantially completed, substantially no absorption peak attributable to amide bonds can be observed but only the absorption peak attributable to imide rings formed by imide ring closure can be observed.

In consideration of its moldability in the thermocompression bonding step and heat resistance at the time of reflow mounting, the adhesive polyimide resin of the present invention must have a glass transition temperature after curing of 50 to 250° C., preferably 100 to 230° C., an elastic modulus at 250° C. of $10^5$ Pa or more, preferably $2 \times 10^5$ Pa or more. With the glass transition temperature of below 50° C., the problem arises in respect of resin strength and reflow resistance while with the glass transition temperature of 250° C. or more, it becomes difficult to obtain satisfactory flowability at a practical contact bonding temperature. If the elastic modulus at 250° C. is below $10^5$ Pa, there will be a high possibility that blistering or peeling off occurs in the reflow step.

By the glass transition temperature is meant one measured by a DMA method. By Young's modulus (storage modulus) is meant one measured by a DMA method.

Further, it is preferred that the adhesive polyimide resin of the present invention has a peel strength retention of 50% or more, the peel strength retention being defined as a ratio $(P_2/P_1)$ of the peel strength $P_1$ obtained by coating a siloxane polyimide precursor-containing resin solution onto a substrate and drying, and then heat-treating at 180° C. for 5 minutes followed by thermocompression-bonding the resultant to an adherend, and the peel strength $P_2$ obtained by thermocompression-bonding the above-mentioned resultant to the adherend after further heat-treating the resultant at 270° C. for 5 minutes. It should be noted that the peel strength may be measured based on the method described in the test method in Examples described later. The peel strength Pi is also a peel strength of the polyimide in a state of a precursor before it is converted into a polyimide resin since the adhesive polyimide resin of the present invention is usually imidated at a temperature not lower than 180° C. The peel strength $P_2$ may in some cases be the same as the peel strength $P_1$. However, it is desirable that the peel strength $P_2$ is one obtained by thermocompression-bonding the adhesive polyimide resin of the present invention after heat-treating it at 270° C. for 5 minutes to an adherend.

The adhesive polyimide resin of the present invention is useful as an adhesive material for electronic components that are often exposed to high temperatures as high as about 270° C. before the bonding. To bond electronic components by using the adhesive polyimide resin of the present invention, it is coated on a supporting substrate, dried and then heat-treated to make it into the adhesive polyimide resin of the present invention having the above-mentioned characteristics and an adherend is thermocompression-bonded thereto.

The laminate of the present invention comprises a substrate comprising having formed thereon in order a conductor, an insulating supporting layer and an adhesive polyimide resin layer. The adhesive polyimide resin layer is comprised by the adhesive polyimide resin of the present invention. The conductor used in the laminate may be any conductor so far as it is made of an electroconductive metal. Specifically, copper, stainless steel, aluminum, tin, foils of electroconductive alloys, etc. can be used. Preferably, copper is used.

The laminate of the present invention has a layered structure comprised by conductor layer/insulating supporting layer/adhesive polyimide resin layer. The insulating supporting layer comprises at least one polyimide resin layer. The insulating supporting layer must have a thermal expansion coefficient of $30 \times 10^{-6}$ or less, preferably $25 \times 10^{-6}$ or less. If the thermal expansion coefficient is above this value, a considerable curl occurs. In the case where the insulating supporting layer is constituted by a plurality of layers, it is just needed that an average thermal expansion coefficient falls in the above-mentioned range. Here, by average thermal expansion coefficient is meant an average of thermal expansion coefficients from 240° C. to 50° C. The adhesive polyimide resin layer is a siloxane polyimide resin having a crosslinkable reactive group, the resin having a glass transition temperature of 50 to 250° C. after curing and an elastic modulus at 250° C. of $10^5$ Pa or more. The adhesive polyimide resin layer has a peel strength at room temperature of 0.8 kN/m or more, preferably 1.0 kN/m or more, as obtained by subjecting it to thermal hysteresis at 270° C. for 5 minutes and then thermocompression-bonding the resultant to a silicon chip adherend.

By the silicon chips adherend as used herein are meant collectively single crystal silicon and those covered on its surface with a passivation film made of silicon nitride or polyimide. The thermocompression conditions and measuring conditions for peel strength are the conditions defined in Examples hereinbelow. A standard of the silicon chip adherend is an ordinary one, and the surface having a silicon nitride or polyimide passivation film and the silicon surface each have the above-mentioned peel strength. It should be noted that the target adherend used in the present invention is not limited to silicon chip. In the present invention, it is meant that any adherend may be used so far as the adhesive polyimide resin has the above-mentioned characteristics on it. In the present invention, the target adherends include silicon chips, copper foil, and other electronic components, etc.

Preferred as the method of producing laminates of the present invention is a method comprising directly coating on a conductor at least one layer of a polyimide precursor resin solution that constitutes an insulating supporting layer, heat curing it to form a conductor/polyimide laminate, then coating an adhesive polyimide resin solution or an adhesive polyimide precursor resin-containing solution, and drying it.

The coating of the insulating supporting layer and adhesive layer on the conductor may be performed by using any apparatus. For example, a die coater, a knife coater, a roll coater and the like can be used. Also, a plurality of resin layers may be coated at the same time by using a multilayer die.

Among the polyimide resins that constitute the insulating supporting layer, some having a specified chemical structure in a state where imide ring closure has occurred may be soluble in polar solvents. Even in such a case, it is preferred that a precursor solution is coated from the viewpoint of adhesion between the polyimide layers. For the same reasons, in the case where a plurality of polyimide resin layers constituting the insulating supporting layer are formed, a method is preferred which comprises once forming a multilayer structure comprised by a polyimide precursor, either by repeating coating a polyimide precursor resin solution and drying it or coating a polyimide precursor resin solution by multilayer extrusion and drying them all at once, and finally hot imide curing them. Furthermore, to suppressing the thermal expansion coefficient of low thermal expansion polyimide to a sufficiently low level, it is preferred that the final curing temperature of the insulating supporting layer is 250° C. or more, more preferably 300° C.

or more. Such a curing of polyimide is performed preferably in an inert gas atmosphere or under reduced pressure in order to prevent the oxidation of the conductor and the deterioration of the resin.

In the case where the siloxane polyimide resin as a main ingredient of the adhesive polyimide resin solution is soluble in solvents, it can be coated in a state of a polyimide solution. In particular, siloxane polyimide precursor solution is poor in viscosity stability at the time of storage and hence it is preferred to use a polyimide solution. Furthermore, in the case where the adhesive polyimide resin has sufficient heat stability at 250° C. or more necessary for curing the insulating supporting layer, the resin solution may be coated on the insulating supporting layer before complete imidation of the insulating supporting layer so that the polyimides in the insulating supporting layer and the adhesive layer can be cured simultaneously.

The laminate of the present invention thus obtained can be applied to various adherends such as silicon chips, insulating resins such as polyimide and epoxy, metals such as copper, aluminum, and alloys thereof, etc., by thermocompression bonding. In the thermocompression bonding with these adherends, hydraulic presses and laminators, and in addition continuous heating or pulse heating type bonding apparatuses used for bonding semiconductors may be employed.

In particular, the laminate of the present invention exhibits sufficient flow characteristics at the time of thermocompression bonding even after undergoing thermal hysteresis and retains reflow heat resistance after curing so that it is suitable as a material for use in a film substrate (interposer) for semiconductor packages that frequently undergo thermal hysteresis in the wiring forming step and semiconductor assembling step. For example, formation of a metal bump penetrating across the adhesive polyimide layer and the insulating supporting layer in advance enables melting of the adhesive polyimide resin onto a silicon surface to seal the surface of the silicon chip simultaneously with the heat bonding between the metal bump and an aluminum pad on the silicon chip.

In the laminate of the present invention, the above-mentioned insulating supporting layer has at least one polyimide resin layer. It is advantageous that the insulating supporting layer has a structure comprised by a low thermal expansion polyimide resin layer and a high thermal expansion polyimide resin layer, with the high thermal expansion polyimide resin layer contacting the conductor. In this case, a ratio (t2)/(t1) of the thickness (t2) of the low thermal expansion polyimide resin layer to the thickness of the high thermal expansion polyimide resin layer is preferably in a range of (t2)/(t1)=2 to 100.

The low thermal expansion polyimide resin may be of any structure so far as it has a thermal expansion coefficient of less than $20 \times 10^{-6}$. However, it is preferred that the low thermal expansion polyimide resin has excellent performances such as mechanical physical properties and heat resistance of the film. Specific examples of the low thermal expansion polyimide resin include those polyamideimide resins and polyimide resins of the general formulae (4) and (5), respectively.

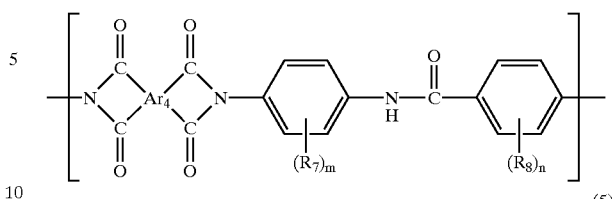

(4)

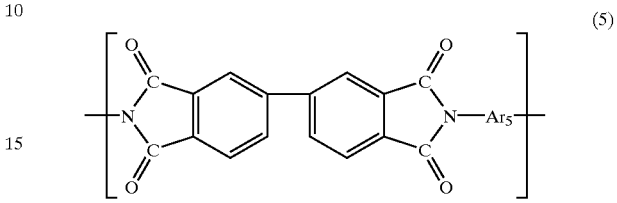

(5)

(In the above formulae, $Ar_4$ represents a tetravalent aromatic group; $R_7$ and $R_8$, which may be the same or different, represent any one of a lower alkyl group, a lower alkoxy group, or a halogen; and m and n are 0 or an inter of from 1 to 4, provided that the resin has at least one lower alkoxy group. $Ar_5$ is a group of the formula (6) below; $R_9$, $R_{10}$ and $R_{11}$ each represent a lower alkyl group, a lower alkoxy group, a halogen group or hydrogen; l, m and n are each 0 or an integer of from 1 to 4; and $R_{10}$ and $R_{11}$ may be the same or different.)

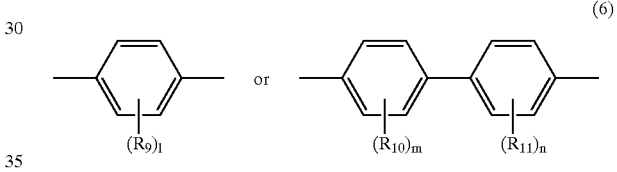

(6)

The polyimide resin that constitutes the high thermal expansion polyimide resin layer may be of any structure without hindrance so far as it has a thermal expansion coefficient of $30 \times 10^{-6}$ or more. The high thermal expansion polyimide resin that contacts the conductor must develop sufficient adhesion with the conductor for serving as a circuit substrate and hence polyimide resins excellent in mechanical physical properties and heat resistance are recommendable. Furthermore, it is preferably a polyimide resin having a glass transition temperature of less than 300° C.

Specific examples of such a polyamide resin include those polyimide resins of the general formula (7) below.

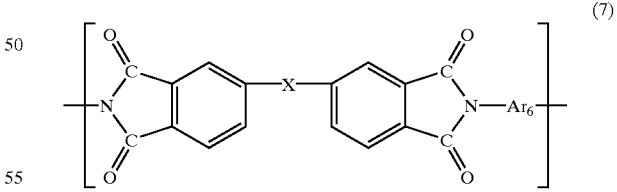

(7)

(In the formula, X is a direct bond, $—SO_2—$, $—O—$, or $—CO—$; and $Ar_6$ is at least one selected from -φ-O-φ-, -φ-O-φ-O-φ-, and -φ-O-φ-Y-φ-O-φ- (where φ represents a benzene ring, and Y is at least one selected from the group consisting of a direct bond, $—C(CH_3)_2—$, $—SO_2—$ or $—C(CF_3)_2—$).)

The polyimide resin used in the insulating supporting layer of the laminate of the present invention can be obtained by heat-curing a polyimide precursor obtained by reacting a diamine compound and an acid anhydride compound in a polar solvent.

The silicon chip-mounted laminate of the present invention can be obtained by bonding a silicon chip adherend to a surface of a laminate on which an adhesive polyimide resin is coated. In this case, it is preferred that the laminate has a 90° peel strength at room temperature of 0.8 kN/m or more between a silicon chip adherend and an adhesive (adhesive polyimide resin) layer, as obtained by subjecting the adhesive silicon chip adherend to thermal hysteresis at 270° C. for 5 minutes and then thermocompression-bonding the resultant onto the adhesive polyimide resin layer under the conditions of 320° C. and 2 MPa. In this case, the adhesive-applied conductor/polyimide laminate is preferably the one that gives the above-mentioned adhesive power to ordinary silicon chip adherend under ordinary bonding conditions even after subjected to thermal hysteresis at 270° C. for 5 minutes.

BEST MODE FOR CARRYING OUT THE INVENTION

Hereinafter, the present invention will be described in detail based on examples and comparative examples. However, the present invention should not be considered to be limited thereto.

Symbols used in the examples indicate the following compounds.
MABA: 2'-methoxy-4,4'-diaminobenzanilide
DDE: 4,4'-diaminodiphenylether
PPD: p-phenylenediamine
APB: 1,3-bis(4-aminophenoxy)benzene
BAPP: 2,2-bis[4-(4-aminophenoxy)phenyl]propane
HAB: 3,3'-dihydroxy-4,4'-diaminobiphenyl
PSX: ω,ω'-bis(3-aminopropyl)polydimethylsiloxane(the number of siloxane unit n=8)
PSX(n=1): ω,ω'-bis(3-aminopropyl)dimethylsiloxane(the number of siloxane unit n=1, molecular weight 248.52)
PSX(vi): ω,ω'-bis(3-aminopropyl)polymethylvinyl siloxane (the average number of siloxane unit m=6.82, molecular weight 836)

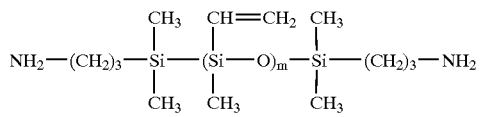

PMDA: pyromellitic acid dianhydride
BPDA: 3,3',4,4'-biphenyltetracarboxylic acid dianhydride
BTDA: 3,3',4,4'-benzophenonetetracarboxylic acid dianhydride
ODPA: 3,3',4,4'-oxydiphthalic acid dianhydride
(Glass Transition Temperature, Young's Modulus)

The resin solution obtained in each Synthesis Example was coated on an aluminum substrate (thickness: 50 μm) release-treated with Teflon, preliminarily dried in a hot air oven at 80° C. for 15 minutes and then subjected to heat treatment at 180° C. for 5 minutes, at 270° C. for 5 minutes, and at 320° C. for 10 seconds in the order cited to obtain a resin film having a thickness of about 60 μm. The dynamic viscoelasticity of the thus obtained film when the film temperature was increased from 0° C. to 350° C. at a rate of 5° C./minute was measured by DMA to obtain a glass transition temperature (tan δ optimum value) and Young's moduli (storage moduli E') at 25° C. and at 250° C., respectively.
(NMP Solubility)

The resin solution obtained in each Synthesis Example was coated on an aluminum substrate (thickness: 50 μm) release-treated with Teflon, preliminarily dried in a hot air oven at 80° C. for 15 minutes and then subjected to heat treatment at 180° C. for 5 minutes, at 270° C. for 5 minutes, and at 320° C. for 10 seconds in the order cited to obtain a resin film having a thickness of about 60 μm. The obtained film was dipped in n-methyl-2-pyrrolidinone (abbreviated as NMP) at 25° C. for 10 minutes and the state of the film was visually observed.
(Peel Strength, Peel Strength Retention)

On a roughened surface of a 35 μm-thick electrolytic copper foil (3EC-III Foil, manufactured by Mitsui Mining & Smelting Co., Ltd., Rz=6.0 μm) was coated the resin solution obtained in each Synthesis Example by using a knife coater so as to have a thickness of 10 μm after drying and subjected to heat treatment at 80° C.-15 minutes and 180° C.-5 minutes in the order cited to obtain (1) an adhesive coated copper foil layer having a 35 μm-thick copper foil layer and a 10 μm-thick polyimide adhesive layer or subjected to heat treatment at 80° C.-15 minutes, 180° C.-5 minutes, and 270° C.-5 minutes in the order cited to obtain (2) an adhesive-provided copper foil having a 35 μm-thick copper foil layer and a 10 μm-thick polyimide adhesive layer. To each of them was thermocompression-bonded a mirror surface of a single crystal silicon chip having an area of 1 cm×1 cm at a temperature of 320° C. and at a pressure of 2 MPa for 10 seconds by using a thermocompression apparatus. The resultant was tested on a tensile tester to measure peel strength in the 90° direction when the side of the adhesive layer-applied copper foil was peeled off at room temperature (pulling speed: 20 mm/minute).

Assuming the peel strengths of the silicon chip against the adhesive layer-provided copper foils (1) and (2) are $P_1$ and $P_2$, respectively, peel strength retention (P) is expressed by,
(P) %=$P_2/P_1$×100
(Thermal Resistance Test in an Infrared Reflow Oven)

By using a thermocompression apparatus, a silicon chip having an area of 1 cm×1 cm was thermocompression-bonded to an adhesive coated electrolytic copper foil (3EC-III Foil, manufactured by Mitsui Mining & Smelting Co., Ltd., Rz=6.0 μm) at a temperature of 320° C. and at a pressure of 2 Mpa for 10 seconds to obtain a sample. The sample absorbed moisture in a thermo-hygrostat at a temperature of 85° C. and at a humidity of 85% for 168 hours. The resultant was heated in a thermal reflow oven at 230° C. for 60 seconds, and judged at this time whether or not a blistering was generated at an interface between the silicon chip and the adhesive layer-provided copper foil.
(Measurement of Peel Strength with Silicon Chip)

By using a thermocompression apparatus, a 1 cm×1 cm silicon chip (polyimide passivation side) was thermocompression-bonded to the adhesive layer side of an adhesive layer-provided copper/polyimide laminate having thermal hysteresis of 270° C. for 5 minutes as in Examples 5 to 8, at a temperature of 320° C. and at a pressure of 2 MPa for 10 seconds. The resultant was tested on a tensile tester to measure peel strength in the 90° direction when the copper-clad laminate side was peeled off at room temperature and at 250° C. (pulling speed: 20 mm/minute).
(Measurement of Linear Expansion Coefficient)

The copper foil in the one side copper clad laminate fabricated in each Example was etched off to obtain a polyimide film having a thickness of 25 μm. A polyimide film sample of 3 mm×20 mm was fixed to an apparatus for thermomechanical analysis, retained at 250° C. for 30 minutes and then the temperature was decreased from 250° C. to room temperature. From the inclination of the obtained curve was obtained an average linear expansion coefficient in a range of from 240° C. to 50° C.

Then, preparation of polyimide precursor resin solutions is shown in Synthesis Examples 1 to 16. Synthesis Examples 1 to 11 are preparation examples of siloxane polyimide precursor resin solutions, Synthesis Examples 12 and 13 are preparation examples of low thermal expansion polyimide precursor resin solutions, and Synthesis Examples 14 to 16 are preparation examples of high thermal expansion polyimide precursor resin solutions.

SYNTHESIS EXAMPLE 1

In a Dean-Stark type reactor equipped with a stirrer and a nitrogen introducing pipe were charged 69.65 g (0.225 mole) of ODPA and 150 g of triglyme, to which 90.00 g (0.1175 mole) of PSX was added by using a dropping funnel under a nitrogen atmosphere, and the mixture was stirred at room temperature for about 2 hours. Subsequently, the reaction mixture was heated at 190° C. under the nitrogen atmosphere, followed by heating and stirring for 15 hours while removing condensation water. Then, the reaction mixture was cooled to room temperature and 36.54 g (0.089 mole) of BAPP, 3.92 g (0.018 mole) of HAB, and 150 g of triglyme were added thereto. The obtained reaction mixture was heated at 70° C. under the nitrogen atmosphere and stirred for about 2 hours to obtain a siloxane polyimide precursor resin solution having a solid content of 40% by weight.

SYNTHESIS EXAMPLE 2

In a reactor were charged 48.58 g (0.1566 mole) of ODPA and 130 g of triglyme, to which 60.00 g (0.0783 mole) of PSX was added by using a dropping funnel under the nitrogen atmosphere and the mixture was stirred at room temperature for about 2 hours. Subsequently, the reaction solution was heated at 190° C. under the nitrogen atmosphere, followed by heating and stirring for 15 hours while removing water. Then, the reaction mixture was cooled to room temperature and 60.06 g (0.1463 mole) of BAPP, 4.22 g (0.0195 mole) of HAB, 27.14 g (0.0875 mole) of ODPA, and 150 g of triglyme were added thereto, and the obtained reaction mixture was heated at 70° C. under the nitrogen atmosphere and stirred for about 2 hours. Further, addition of triglyme so that the solid content was 40% by weight to obtain a siloxane polyimide precursor resin solution.

SYNTHESIS EXAMPLE 3

In a reactor were charged 65.61 (0.223 mole) of BPDA and 130 g of triglyme, to which 99.96 g (0.1305 mole) of PSX was added by using a dropping funnel under the nitrogen atmosphere, and the mixture was stirred at room temperature for about 2 hours. Subsequently, the reaction mixture was heated at 190° C. under the nitrogen atmosphere, followed by heating and stirring for 15 hours while removing condensation water. Then, the reaction mixture was cooled to room temperature and 30.54 g (0.0744 mole) of BAPP, 3.85 g (0.0178 mole) of HAB, and 150 g of triglyme were added thereto. The obtained reaction mixture was heated at 70° C. under the nitrogen atmosphere and stirred for about 2 hours. Further, triglyme was added so that the solid content was 40% by weight to obtain a siloxane polyimide precursor resin solution.

SYNTHESIS EXAMPLE 4

In a reactor were charged 23.48 g (0.0757 mole) of ODPA and 35 g of NMP, to which 10.51 g (0.0423 mole) of PSX (n=1) was added by using a dropping funnel under the nitrogen atmosphere and the mixture was stirred at room temperature for about 2 hours. Subsequently, the reaction mixture was heated at 190° C. under the nitrogen atmosphere, followed by heating and stirring for 5 hours while removing water. Then, the reaction mixture was cooled to room temperature, 4.50 g (0.0054 mole) of PSX (vi) was added by using a droping funnel, and 11.54 g (0.0281 mole) of BAPP and 35 g of NMP were then added thereto, and the obtained reaction mixture was stirred for about 2 hours under the nitrogen atmosphere. Further, NMP was added so that the solid content was 40% by weight to obtain a siloxane polyimide precursor resin solution.

SYNTHESIS EXAMPLE 5

In a reactor were charged 70.11 g (0.2260 mole) of ODPA and 130 g of triglyme, to which 80.00 g (0.10444 mole) of PSX was added by using a dropping funnel under the nitrogen atmosphere, and the resultant mixture was stirred at room temperature for about 2 hours. Subsequently, the reaction mixture was heated at 190° C. under the nitrogen atmosphere, followed by heating and stirring for 15 hours while removing condensation water. Then, the reaction mixture was cooled to room temperature and 49.88 g (0.1215 mole) of BAPP and 150 g of triglyme were added thereto. The obtained reaction mixture was heated at 70° C. under the nitrogen atmosphere and stirred for about 2 hours. Further, triglyme was added so that the solid content was 40% by weight to obtain a siloxane polyimide precursor resin solution.

SYNTHESIS EXAMPLE 6

In a reactor were charged 64.11 g (0.2179 mole) of BPDA and 130 g of triglyme, to which 99.96 g (0.1305 mole) of PSX was added by using a dropping funnel under the nitrogen atmosphere and the mixture was stirred at room temperature for about 2 hours. Subsequently, the reaction mixture was heated at 190° C. under the nitrogen atmosphere, followed by heating and stirring for 15 hours while removing condensation water. Then, the reaction mixture was cooled to room temperature and 35.88 g (0.0874 mole) of BAPP and 150 g of triglyme were added thereto, and the obtained reaction mixture was heated at 70° C. under the nitrogen atmosphere and stirred for about 2 hours. Further, addition of triglyme was performed so that the solid content was 40% by weight to obtain a siloxane polyimide precursor resin solution.

SYNTHESIS EXAMPLE 7

In a Dean-Stark type reactor equipped with a stirrer and a nitrogen introducing pipe were charged 17.34 g (0.056 mole) of ODPA and 175 g of triglyme, to which 22.50 g (0.0294 mole) of PSX was added by using a dropping funnel under the nitrogen atmosphere and the mixture was stirred at room temperature for about 2 hours. Subsequently, the reaction solution was heated at 190° C. under the nitrogen atmosphere, followed by heating and stirring for 15 hours while removing water. Then, the reaction mixture was cooled to room temperature and 62.79 g (0.153 mole) of BAPP, 3.45 g (0.0158 mole) of HAB, 44.06 g (0.142 mole) of ODPA, and 175 g of triglyme were added thereto. The obtained reaction mixture was heated at 70° C. under the nitrogen atmosphere and stirred for about 2 hours to obtain a siloxane polyimide precursor resin solution having a solid content of 30% by weight.

SYNTHESIS EXAMPLE 8

Following Synthesis Example 3, a siloxane polyimide precursor resin solution was obtained having the same solid content as in Synthesis Example 3, i.e., 40% by weight.

SYNTHESIS EXAMPLE 9

A siloxane polyimide precursor resin solution having a slid content of 40% by weight was prepared in the same manner as in synthesis Example 1 except that 100.00 g (0.1305 mole) of PSX, 33.30 g (0.0810 mole) of BAPP, and 1.92 g (0.0088 mole) of HAB were used as the diamine ingredients, and 65.01 g (0.2204 mole) of BPDA was used as the acid anhydride ingredient.

SYNTHESIS EXAMPLE 10

Following Synthesis Example 5, a siloxane polyimide precursor resin solution was obtained having the same solid content as in Synthesis Example 5, i.e., 40% by weight. In this case, however, the use amount of initially added triglyme (solvent) was set to 150 g.

SYNTHESIS EXAMPLE 11

Following Synthesis Example 6, a siloxane polyimide precursor resin solution was obtained having the same solid content as in Synthesis Example 5, i.e., 40% by weight.

SYNTHESIS EXAMPLE 12

In a reactor equipped with a stirrer and a nitrogen introducing pipe were charged 556 g of N,N-dimethylacetamide while introducing nitrogen, and subsequently 28.30 g (0.110 mole) of MABA and 22.03 g (0.110 mole) of DDE were charged with stirring for dissolution. The reactor was cooled to 10° C. and 47.84 g (0.209 mole) of PMDA was added by a small amount at a time so that the internal temperature was maintained at 30° C. or lower. After completion of the addition, the reaction solution was subsequently stirred at room temperature for 2 hours to complete the polymerization reaction. The resultant had an apparent viscosity at 25° C. of about 800 poises as measured by using a B type viscometer.

SYNTHESIS EXAMPLE 13

A low thermal coefficient polyimide precursor solution having an apparent viscosity at 25° C. of 750 poises was prepared in the same manner as in Synthesis Example 12 except that 32.44 g (0.30 mole) of PPD as the diamine ingredient, 88.26 g (0.30 mole) of BPDA as the acid anhydride and 624.30 g of N-methylpyrrolidone as the polymerization solvent were respectively used.

SYNTHESIS EXAMPLE 14

A polyimide precursor solution having an apparent viscosity at 25° C. of 910 poises was prepared in the same manner as in Example 12 except that 60.072 g (0.30 mole) of DDE as the diamine ingredient, 65.437 g (0.30 mole) of PMDA as the acid anhydride and 711.22 g of N-methylpyrrolidone as the polymerization solvent were respectively used.

SYNTHESIS EXAMPLE 15

A high thermal expansion polyimide precursor solution having an apparent viscosity at 25° C. of about 300 poises was prepared in the same manner as in Example 14 except that 40.05 g (0.200 mole) of DDE as the diamine ingredient, 64.45 g (0.200 mole) of BTDA as the acid anhydride ingredient and 592 g of N,N-dimethylacetamide as the polymerization solvent were respectively used.

SYNTHESIS EXAMPLE 16

A high thermal expansion polyimide precursor solution having an apparent viscosity at 25° C. of 85 poises was prepared in the same manner as in Example 14 except that 37.38 g (0.127 mole) of APB as the diamine ingredient, 337.02 g (0.125 mole) of BPDA as the acid anhydride ingredient and 425 g of N,N-dimethylacetamide as the polymerization solvent were respectively used.

EXAMPLE 1

On a roughened surface of a 35 µm-thick electrolytic copper foil (3EC-III Foil, manufactured by Mitsui Mining & Smelting Co., Ltd., Rz=7.0 µm) was coated the polyimide precursor resin solution obtained in Synthesis Example 1 by using a knife coater so as to have a thickness of 10 µm after drying and subjected to heat treatment at 80° C. for 15 minutes, and 180° C. for 5 minutes, or heat treatment at 80° C. for 15 minutes, 180° C. for 5 minutes, and 270° C. for 5 minutes in the order cited to respectively obtain an adhesive layer-provided copper foil layer having a 35 µm-thick copper foil layer and a polyimide adhesive layer of 10 µm.

EXAMPLES 2 TO 4 AND COMPARATIVE EXAMPLES 1 AND 2

Adhesive layer-provided copper foils each having a 35 µm-thick copper foil layer and a 10 µm-thick polyimide adhesive layer were obtained in the same manner as in Example 1 except that the polyimide precursor resin solutions obtained in Synthesis Examples 2 to 6, respectively, were used for forming the adhesive layer polyimide resins.

COMPARATIVE EXAMPLE 3

To 100 parts by weight of the polyimide precursor resin solution obtained in Synthesis Example 5 was added 40 parts by weight of novolac type epoxy resin YDCN-704P (manufactured by Totokasei Co., Ltd., epoxy equivalent= 207.3 g/eq) and the mixture was stirred and mixed at room temperature for 2 hours to obtain a polyimide precursor/epoxy mixed resin solution. An adhesive layer-provided copper foil having a 35 µm-thick copper foil layer and a 10 µm-thick polyimide adhesive layer was obtained in the same manner as in Example 1 except that the mixed resin solution was used.

COMPARATIVE EXAMPLE 4

To 100 parts by weight of the polyimide precursor resin solution obtained in Synthesis Example 5 was added 40 parts by weight of bisphenol A type epoxy resin YD-011 (manufactured by Totokasei Co., Ltd., epoxy equivalent= 474.7 g/eq) and the mixture was stirred and mixed at room temperature for 2 hours to obtain a polyimide precursor/epoxy mixed resin solution. An adhesive layer-provided copper foil having a 35 µm-thick copper foil layer and a 10 µm-thick polyimide adhesive layer was obtained in the same manner as in Example 1 except that the mixed resin solution was used.

Table 1 shows a summary of measurement results of peel strength and peel strength retention when the adhesive layer-provided copper foil was bonded to the mirror surface of a single crystal silicon chip, heat resistance tests in an infrared reflow oven, NMP solubility of a film having only an adhesive layer, glass transition temperature measured by dynamic viscoelasticity, and Young's modulus.

TABLE 1

|  | Examples | | | | Comparative Examples | | | |
| --- | --- | --- | --- | --- | --- | --- | --- | --- |
|  | 1 | 2 | 3 | 4 | 1 | 2 | 3 | 4 |
| Resin solution Synthesis Example No. | 1 | 2 | 3 | 4 | 5 | 6 | 5 | 5 |
| Glass transition temperature (° C.) | 113 | 191 | 109 | 113 | 124 | 105 | 122 | 123 |
| Elastic modulus [25° C.] (MPa) | 1014 | 1521 | 748 | 2134 | 972 | 643 | 1509 | 1267 |
| Elastic modulus [250° C.] (MPa) | 2.9 | 5.4 | 0.28 | 0.68 | *1 | *1 | 3.8 | 0.60 |
| Peel strength retention (%) | 91 | 74 | 61 | 65 | 84 | 72 | No bonding | 5 |
| 180° C. treated peel strength (kN/m) | 2.45 | 1.48 | 1.89 | 1.99 | 1.97 | 1.73 | *1 | 1.92 |
| 270° C. treated peel strength | 2.24 | 1.10 | 1.15 | 1.30 | 1.66 | 1.26 | *1 | 0.10 |
| Heat resistance in infrared reflow oven (Blistering) | None | None | None | None | Generated | Generated | *1 | None |
| NMP solubility | Insoluble | Insoluble | Insoluble | Insoluble | Dissolved | Dissolved | Insoluble | Insoluble |

*1 Unable to be measured

EXAMPLE 5

On a roughened surface of a 18 μm-thick roll-shaped electrolytic copper foil (SLP Foil, manufactured by Nippon Denkai, Ltd.) was coated the high thermal expansion polyimide resin solution obtained in Synthesis Example 16 by using a knife coater so as to have a thickness of 2.0 μm after curing, and then treatment was performed in a continuous drying oven of a hot air type for 2 minutes at 130° C. to remove the solvent.

Then, on this was coated the low thermal expansion polyimide precursor solution obtained in Synthesis Example 13 so as to have a thickness of 23 μm after curing by using a die coater to form a laminate and the laminate was treated in a continuous drying oven of a hot air type at 130° C. for 12 minutes and further heat-treated for 30 minutes while increasing the temperature from 130° C. to 360° C. to imidate the precursor to obtain a one side copper clad laminate having a 25 μm-thick insulating supporting layer without curls. The polyimide film after etching off the copper foil had a linear expansion coefficient of 19×10⁻⁶ (1/K).

Then, the adhesive layer-provided polyimide resin solution obtained in Synthesis Example 1 was coated on one side copper clad laminate cut into a sheet shape, by using a knife coater to a thickness of 10 μm after drying such that the formed resin was laminated on the low thermal expansion polyimide layer and heat-treated at 180° C. for 15 minutes, ¥80° C. for 5 minutes, and 270° C. for 5 minutes in the order cited to form a substantially flat adhesive layer-provided copper/polyimide laminate without curls but with a 25 μm-thick insulating supporting layer and a 10 μm-thick adhesive layer.

EXAMPLE 6

On a roughened surface of a 18 μm-thick roll-shaped rolled copper foil (FX-BSH Foil, manufactured by Mitsui Mining & Smelting Co., Ltd.) was coated the high thermal expansion polyimide resin obtained in Synthesis Example 15 by using a knife coater so as to have a thickness of 2.0 μm after curing, and then treatment was performed in a continuous drying oven of a hot air type at 130° C. for 2 minutes to remove the solvent.

Then, on this was coated the low thermal expansion polyimide precursor solution obtained in Synthesis Example 12 so as to have a thickness of 21 μm after curing by using a die coater to form a laminate and the laminate was treated in a continuous drying oven of a hot air type at 130° C. for 12 minutes to remove the solvent.

Then, the high thermal expansion polyimide precursor resin of Synthesis Example 15 was again coated to a thickness of 2 μm after curing by using a knife coater and treated at 130° C. for 12 minutes and further heat-treated for 30 minutes while increasing the temperature from 130° C. to 360° C. to imidate the precursor to obtain a one side copper clad laminate having a 25 μm-thick insulating supporting layer without curls. The polyimide film after etching off the copper foil had a linear expansion coefficient of 20×10⁻⁶ (1/K).

Then, the adhesive layer polyimide resin solution obtained in Synthesis Example 7 was coated on the one side copper clad laminate cut into a sheet shape by using a knife coater to a thickness of 10 μm after curing such that the formed resin was laminated on the low thermal expansion polyimide layer and heat-treated at 80° C. for 15 minutes, 180° C. for 5 minutes, 270° C. for 5 minutes, and 300° C. in the order cited to form substantially flat adhesive layer-provided copper/polyimide laminate without curls but with a 25 μm-thick insulating supporting layer and a 10 μm-thick adhesive layer.

EXAMPLES 7 AND 8

Adhesive coated copper/polyimide laminate each having a 25 μm-thick insulated supporting layer and a 10 μm-thick polyimide adhesive layer were obtained in the same manner as in Example 6 except that the siloxane polyimide polyamic acid copolymer resin solutions obtained in Synthesis Examples 8 and 9 were respectively used at the adhesive layer polyimide resins.

COMPARATIVE EXAMPLES 5 AND 6

Adhesive coated copper/polyimide laminate each having a 25 μm-thick insulated supporting layer and a 10 μm-thick polyimide adhesive layer were obtained in the same manner as in Example 1 except that the siloxane polyimide polyamic acid copolymer resin solutions obtained in Synthesis Examples 10 and 11 were respectively used as adhesive polyimide resins.

COMPARATIVE EXAMPLE 7

A one side copper clad laminate having a 25 μm-thick insulating supporting layer was obtained in the same manner as in Example 6 except that the polyimide precursor resin solution obtained in Synthesis Example 14 was used as the low thermal expansion polyimide precursor solution. The polyimide after etching had a linear expansion coefficient of $40 \times 10^{-6}$ (1/K). The one side copper clad laminate had a significant curl and after coating the adhesive layer polyimide, the laminate could not be subjected to the thermocompression bonding step for bonding with a silicon chip.

Table 2 shows a summary of glass transition temperature, elastic moduli at 25° C. and 250° C., respectively, generation of curls, characteristics at the time of bonding with a silicon chip.

present invention is suitable as a base material for semiconductor film packages and build up substrates of which excellent reliability is required.

What is claimed is:

1. An adhesive polyimide resin comprising a siloxane polyimide resin obtained from (A) an aromatic tetracarboxylic dianhydride and (B) a diamine ingredient comprising (B1) a diamine having a crosslinkable reactive group and (B2) a siloxanediamine, said crosslinkable reactive group being a phenolic hydroxyl group, a carboxyl group or a vinyl group, and said adhesive polyimide resin having a glass transition temperature of from 50 to 250° C. and a Young's modulus (storage modulus) at 250° C. of $10^5$ Pa or more.

TABLE 2

|  | Examples | | | | Comparative Examples | | |
| --- | --- | --- | --- | --- | --- | --- | --- |
|  | 5 | 6 | 7 | 8 | 5 | 6 | 7 |
| Insulating supporting layer Synthesis Example No. | | | | | | | |
| First layer | 16 | 15 | 15 | 15 | 15 | 15 | 15 |
| Second layer | 13 | 12 | 12 | 12 | 12 | 12 | 14 |
| Third layer | — | 15 | 15 | 15 | 15 | 15 | 15 |
| Polyimide Adhesive layer | | | | | | | |
| Synthesis Example No. | 1 | 7 | 8 | 9 | 10 | 11 | 7 |
| Glass transition temperature (° C.) | 113 | 227 | 109 | 108 | 124 | 105 | 227 |
| Elastic modulus [25° C.] (MPa) | 1014 | 2009 | 748 | 722 | 972 | 643 | 2009 |
| Elastic modulus [250° C.] (MPa) | 2.9 | 6.3 | 0.28 | 0.26 | 0.19 | 0.01> | 6.3 |
| Generation of curls | None | None | None | None | None | None | Significant |
| Room temperature peel strength (kN/m) | 1.49 | 0.89 | 1.10 | 1.20 | 1.45 | 1.17 | — |
| 250° C. treated peel strength (kN/m) | 0.20 | 0.36 | 0.20 | 0.12 | 0.17 | 0.16 | — |
| Heat resistance in infrared reflow oven (Blistering) | None | None | None | None | Generated | Generated | — |

INDSUTRIAL APPLICABILITY

The adhesive polyimide resin of the present invention is excellent in heat resistance and exhibits a minimized reduction in adhesiveness even when exposed to relatively high temperature in treating step or the like before the bonding of electronic components thereto and hence it can be used widely as an adhesive material for electronic components. Because of such characteristics, the adhesive polyiimide resin of the present invention are suitable for use in particular in adhesives for semiconductor packages, die bonding agent for interlayer insulation films of wiring components such as printed board or semiconductors packages, and heat resistant adhesives for other electronic materials. The adhesive polyimide resin of the present invention is useful for laminates having the above-mentioned adhesive polyimide resin layer with good flowability in the thermocompression bonding step and excellent in adhesion and heat resistance at the time of reflow, which are useful as a base material for interposer for semiconductor packages and a base material for build up wiring board. Further, the laminate of the present invention enables thermocompression bonding at a high temperature even after undergoing thermal hysteresis corresponding to 270° C. for 5 minutes and has excellent adhesion with silicon chip and wiring board conductor and excellent reflow heat resistance so that it can retain adhesiveness in spite of such a thermal hysteresis in the production process for electronic components. Therefore, the adhesive-provided conductor/polyimide laminate of the 2. The adhesive polyimide resin according to claim 1, which has a peel strength retention of 50% or more,
   wherein the peel strength retention is defined as a ratio ($P_2/P_1$) of (A) the peel strength $P_1$ obtained by coating onto a substrate a siloxane polyimide precursor-containing resin solution in a stage prior to forming the adhesive polyimide resin, drying, heat-treating at 180° C. for 5 minutes, and thermocompression-bonding the resultant to an adherend, and (B) the peel strength $P_2$ obtained by thermocompression-bonding the resultant to an adherend after further heat-treating the resultant at 270° C. for 5 minutes.

3. A laminate which comprises a substrate having formed thereon a conductor, at least one layer of an insulating supporting layer and an adhesive polyimide resin layer, said insulating supporting layer having an average thermal expansion coefficient of $30 \times 10^{-6}$ or less, and said adhesive polyimide resin layer comprising a siloxane polyimide resin obtained from (A) an aromatic tetracarboxylic dianhydride and (B) a diamine ingredient comprising (B1) a diamine having a crosslinkable reactive group and (B2) a siloxanediamine, and said adhesive polyimide resin layer having a glass transition temperature of from 50 to 250° and a Young's modulus (storage modulus) at 250° C. of $10^5$ Pa or more.

4. The laminate according to claim 3, wherein the laminate has bonded thereto at least one silicon chip through the adhesive polyimide resin layer on a bonding surface, the adhesive polyimide resin layer having a 90° peel strength between a surface of the silicon chip and the adhesive polyimide resin layer at room temperature of 0.8 kN/m or more at the bonding surface.

5. The laminate according to claim 3, wherein the polyimide resin of the insulating supporting layer has a multilayer structure comprised of a plurality of polyimide resin layers having different thermal expansion coefficients from each other, wherein a thickness ratio of the thickness (t1) of a high thermal expansion resin layer having a thermal expansion coefficient of $30 \times 10^{-6}$ or more to the thickness (t2) of a low thermal expansion resin layer having a thermal expansion coefficient of less than $20 \times 10^{-6}$ is in a range of 2<t2/t1<100, and wherein the high thermal expansion resin layer contacts the conductor.

6. A method of producing the laminate according to claim 3, comprising directly coating a polyimide precursor resin solution on a conductor to form at least one layer of a polyimide precursor resin on the conductor, heat curing the polyimide precursor resin layer to form a conductor/polyimide laminate, then coating an adhesive polyimide precursor resin solution on a polyimide surface of the laminate, and heating it to obtain the laminate.

7. A polyimide resin which comprises a siloxane polyimide resin obtained from (A) an aromatic tetracarboxylic dianhydride and (B) a diamine ingredient comprising (B1) a diamine having a crosslinkable reactive group and (B2) a siloxanediamine, said crosslinkable reactive group being a phenolic hydroxyl group, a carboxyl group or a vinyl group, and said polyimide resin having a glass transition temperature of from 50 to 250° C. and a Young's modulus (storage modulus) at 250° C. of $10^5$ Pa or higher.

8. A laminate which comprises a substrate having formed thereon a conductor, at least one layer of an insulating supporting layer and an adhesive polyimide resin layer, said insulating supporting layer having an average thermal expansion coefficient of $30 \times 10^{-6}$ or less, and said adhesive polyimide resin layer comprising a siloxane polyimide resin obtained from (A) an aromatic tetracarboxylic dianhydride and (B) a diamine ingredient comprising (B1) a diamine having a crosslinkable reactive group and (B2) a siloxanediamine, said crosslinkable reactive group being a phenolic hydroxyl group, a carboxyl group or a vinyl group, and said adhesive polyimide resin layer having a glass transition temperature of from 50 to 250° C. and a Young's modulus (storage modulus) at 250° C. of $10^5$ Pa or more.

9. The laminate according to claim 3, wherein the adhesive polyimide resin has a peel strength retention of 50% or more, and wherein the peel strength retention is defined as a ratio ($P_2/P_1$) of (A) the peel strength $P_1$ obtained by coating onto a substrate a siloxane polyimide precursor-containing resin solution in a stage prior to forming the adhesive polyimide resin, drying, heat-treating at 180° C. for 5 minutes, and thermocompression-bonding the resultant to an adherend, and (B) the peel strength P2 obtained by thermocompression-bonding the resultant to an adherend after further heat-treating the resultant at 270° C. for 5 minutes.

* * * * *